(12) United States Patent
Tzu et al.

(10) Patent No.: US 9,490,150 B2
(45) Date of Patent: Nov. 8, 2016

(54) SUBSTRATE SUPPORT FOR SUBSTRATE BACKSIDE CONTAMINATION CONTROL

(75) Inventors: Gwo-Chuan Tzu, Sunnyvale, CA (US); Olkan Cuvalci, Sunnyvale, CA (US); Yu Chang, San Jose, CA (US); Xiaoxiong Yuan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 268 days.

(21) Appl. No.: 13/540,710

(22) Filed: Jul. 3, 2012

(65) Prior Publication Data

US 2014/0008349 A1 Jan. 9, 2014

(51) Int. Cl.
*H01L 21/67* (2006.01)
*H05B 3/14* (2006.01)
*H01L 21/687* (2006.01)

(52) U.S. Cl.
CPC ... *H01L 21/67109* (2013.01); *H01L 21/67103* (2013.01); *H01L 21/6875* (2013.01); *H05B 3/143* (2013.01)

(58) Field of Classification Search
CPC ... H01L 21/67; H01L 21/109; H01L 21/103; H01L 21/67109; H01L 21/67103; C23C 16/46; C23C 16/455; C30B 25/14; B23K 37/0461; H05B 3/143
USPC ............................. 118/724, 725; 219/121.58
See application file for complete search history.

(56) References Cited

U.S. PATENT DOCUMENTS

| | | | | |
|---|---|---|---|---|
| 6,035,101 A * | 3/2000 | Sajoto | ................ | C23C 16/4586 118/728 |
| 6,223,447 B1 * | 5/2001 | Yudovsky | ......... | H01L 21/68721 118/725 |
| 6,494,955 B1 * | 12/2002 | Lei | .................... | C23C 16/45521 118/715 |
| 7,068,489 B2 * | 6/2006 | Migita | ................ | H01L 21/6831 361/230 |
| 7,503,980 B2 * | 3/2009 | Kida | ................... | C23C 16/4581 118/500 |
| 7,674,338 B2 | 3/2010 | Guenther et al. | | |
| 2003/0127493 A1 * | 7/2003 | Ciriza | .................. | B23K 9/0282 228/42 |
| 2006/0075970 A1 | 4/2006 | Guenther et al. | | |
| 2006/0130767 A1 | 6/2006 | Herchen | | |

(Continued)

FOREIGN PATENT DOCUMENTS

| JP | WO2007/018157 | * | 2/2007 |
|---|---|---|---|
| JP | 2010-272730 A | | 12/2010 |

(Continued)

OTHER PUBLICATIONS

International Search Report and Written Opinion mailed Sep. 17, 2013 for PCT Application No. PCT/US2013/048060.

*Primary Examiner* — Dana Ross
*Assistant Examiner* — Kuangyue Chen
(74) *Attorney, Agent, or Firm* — Moser Taboada; Alan Taboada

(57) ABSTRACT

Embodiments of substrate supports are provided herein. In some embodiments, a substrate support may include a first aluminum plate for supporting a substrate, the first aluminum plate having a plurality of heating elements embedded therein to provide a plurality of heating zones; a second aluminum plate disposed beneath and supporting the first aluminum plate; a third aluminum plate disposed beneath and supporting the second aluminum plate; a non-metallic ring disposed atop the first aluminum plate; and a plurality of spacers having an upper portion disposed above a surface of the first aluminum plate, wherein the non-metallic ring and the plurality of spacers support the substrate above the first aluminum plate.

18 Claims, 5 Drawing Sheets

(56) References Cited

U.S. PATENT DOCUMENTS

| | | | |
|---|---|---|---|
| 2007/0040265 A1* | 2/2007 | Umotoy | C23C 16/45521 257/704 |
| 2007/0258186 A1* | 11/2007 | Matyushkin | H01L 21/67109 361/234 |
| 2009/0179366 A1* | 7/2009 | Herchen | H01L 21/67126 269/21 |
| 2009/0235866 A1* | 9/2009 | Kataigi | C23C 16/45521 118/725 |
| 2010/0046134 A1 | 2/2010 | Mizuno et al. | |
| 2010/0162956 A1* | 7/2010 | Murakami | C23C 16/4586 118/725 |
| 2010/0224130 A1* | 9/2010 | Smith | C23C 16/4584 118/725 |
| 2011/0031111 A1* | 2/2011 | Kobayashi | H01J 37/32623 204/192.34 |
| 2012/0085285 A1* | 4/2012 | Hiramatsu | C30B 25/12 118/725 |

FOREIGN PATENT DOCUMENTS

| | | |
|---|---|---|
| KR | 10-2007-0001036 A | 1/2007 |
| KR | 10-2011-0025101 A | 3/2011 |
| KR | 10-2011-0089692 A | 8/2011 |

* cited by examiner

SUBSTRATE SUPPORT FOR SUBSTRATE BACKSIDE CONTAMINATION CONTROL

FIELD

Embodiments of the present invention generally relate to a semiconductor processing equipment.

BACKGROUND

Conventional substrate supports utilized in deposition process chambers may include a heater plate fabricated from a steel alloy, for example, such as stainless steel. However, the inventors have observed that the low heat conductivity of stainless steel may create a temperature gradient across the heating plate (e.g., a temperature variation from the center to edge of the heater plate), causing uneven heating of the substrate, thereby leading to process non-uniformities. In addition, the high (radio frequency) RF resistivity of the stainless steel causes non-uniform plasma distribution, thereby further leading to non-uniform deposition of materials atop the substrate in plasma-assisted substrate processes.

The inventors have also observed that when using a substrate support having a metal heater plate during a substrate process (e.g., a deposition process), contamination of the substrate may occur as a result of metal to substrate contact. For example, when utilizing a conventional heater plate fabricated from stainless steel, iron (Fe) from the heater plate may diffuse into a back surface of the substrate, thereby contaminating the substrate.

Therefore, the inventors have provided embodiments of improved substrate supports.

SUMMARY

Embodiments of substrate supports are provided herein. In some embodiments, a substrate support may include a first aluminum plate for supporting a substrate, the first aluminum plate having a plurality of heating elements embedded therein to provide a plurality of heating zones; a second aluminum plate disposed beneath and supporting the first aluminum plate; a third aluminum plate disposed beneath and supporting the second aluminum plate; a non-metallic ring disposed atop the first aluminum plate; and a plurality of spacers having an upper portion disposed above a surface of the first aluminum plate, wherein the non-metallic ring and the plurality of spacers support the substrate above the first aluminum plate.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
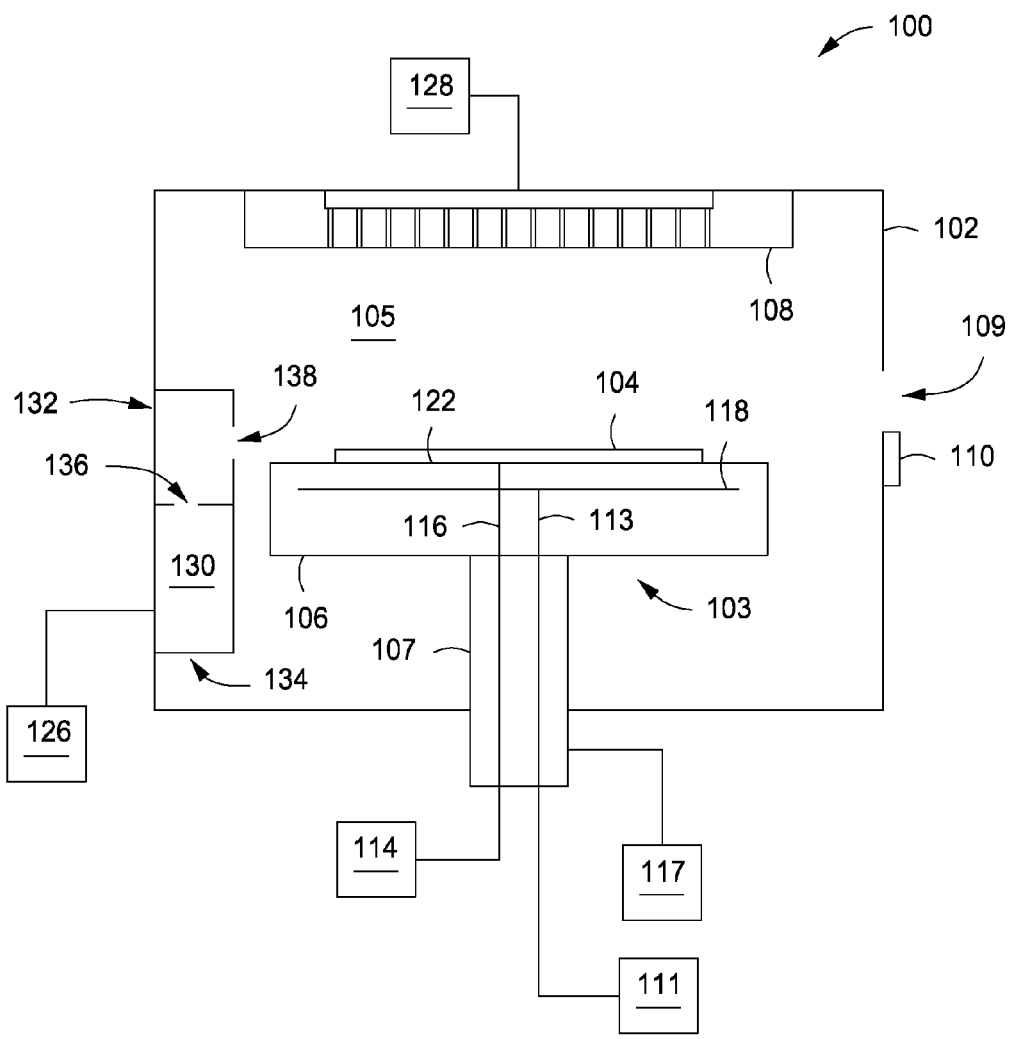
FIG. 1 depicts a process chamber suitable for use with a substrate support in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Substrate supports that may provide one or more of improved backside contamination control, heat distribution, or improved plasma uniformity are provided herein. Embodiments of the inventive substrate support may advantageously support a substrate above a heater plate during processing, thereby eliminating any direct substrate to metal contact, thus reducing or eliminating contamination of the substrate. Embodiments of the inventive substrate support may further advantageously provide a heater plate fabricated from aluminum, thereby providing an improved heat distribution over conventionally utilized stainless steel heater plates, due to the higher heat conductivity of aluminum as compared to stainless steel. In addition, the lower RF resistivity of aluminum (as compared to stainless steel), facilitates providing an improved RF grounding path, thereby providing improved plasma uniformity in plasma-assisted processes. While not intended to be limiting of the scope of the invention, the inventive substrate support disclosed herein may be particularly advantageous in process chambers configured for chemical vapor deposition (CVD) having radio frequency (RF) capability, for example such as CVD process chambers suitable to process 200, 300, or 450 mm substrates, or the like.

FIG. 1 depicts a process chamber 100 suitable for use with a substrate support having a heater in accordance with some embodiments of the present invention. The process chamber 100 may be any process chamber suitable for performing one or more substrate processes, for example, deposition process such as chemical vapor deposition (CVD), physical vapor deposition (PVD), atomic layer deposition (ALD) or the like. In embodiments where the process chamber is a CVD chamber, the CVD chamber may be any suitable CVD chamber known in the art. For example, the CVD chamber may be a standalone process chamber or a part of a cluster tool, such as one of the CENTURA®, PRODUCER®, or ENDURA® cluster tools available from Applied Materials, Inc. of Santa Clara, Calif.

In some embodiments, the process chamber 100 may generally include a chamber body 102, a substrate support 103 for supporting a substrate 104 and one or more gas inlets (e.g., showerhead 108) for providing one or more processes gases to an inner volume 105 of the chamber body 102.

In some embodiments, the chamber body 102 may comprise one or more openings (one opening 109 shown) to allow for the substrate 104 to be provided to, and removed from, the process chamber 100. The opening 109 may be selectively sealed via a slit valve 110, or other mechanism for selectively providing access to the inner volume 105 of the chamber body 102 through the opening 109. In some embodiments, the substrate support 103 may be coupled to a lift mechanism 117 that may control the position of the substrate support 103 between a lower position (as shown) suitable for transferring substrates into and out of the chamber via the opening 109 and a selectable upper position suitable for processing. The process position may be selected to maximize process uniformity for a particular process. When in at least one of the elevated processing positions, the substrate support 103 may be disposed above the opening 109 to provide a symmetrical processing region.

The one or more gas inlets (e.g., showerhead 108) may be coupled to a first gas source 128 for providing one or more process gases for carrying out processes in the process chamber 100. Although a showerhead 108 is shown, additional or alternative gas inlets may be provided such as nozzles or inlets disposed in the ceiling or on the sidewalls of the process chamber 100 or at other locations suitable for providing gases as desired to the process chamber 100, such as the base of the chamber body 102, the periphery of the substrate support 103, or the like.

In some embodiments, the process chamber 100 further includes an exhaust 130 coupled to a pump 126 for removing process gases, purge gases, processing byproducts, and the like from the process chamber 100, for example, via one or more openings 138 fluidly coupling the inner volume 105 of the chamber body 102 with the exhaust 130. In some embodiments, the exhaust 130 may be disposed about the walls of the chamber body 102 and may further be split into an upper exhaust 132 and a lower exhaust 134 with one or more openings 136 disposed between the upper and lower exhaust 132, 134 to control the flow of the process gases, etc., through the exhaust 130 and to the pump 126 (e.g., to provide more azimuthally uniform flow from the processing region of the process chamber above the substrate to the exhaust 130 due to the asymmetric pump configuration).

The substrate support 103 generally comprises a plate (heater plate) 106 configured to support the substrate 104 and a substrate support shaft 107 to support the plate 106. In some embodiments, one or more heating elements 118 may be embedded within or recessed within the plate 106, thereby allowing the plate 106 to function as a heater. A power source may provide power to the heating element 118 via a conduit 113 disposed within the substrate support shaft 107. In some embodiments, a sheath may be provided to surround heating elements 118. The sheath may be fabricated from a conductive metal, for example, such as aluminum. The inventors have observed that fabricating sheaths of the heating elements 118 from aluminum may provide an improved heat distribution over conventionally utilized stainless steel sheathed heater elements due to the high heat conductivity of aluminum as compared to stainless steel. In addition, the aluminum sheaths have the same thermal expansion as the heater plate 106, thereby reducing or eliminating thermal stresses that may occur due to thermal expansion/contraction mismatch between components.

In some embodiments, a gas, for example a purge gas (e.g., an inert gas, such as argon), may be provided by a second gas source 114 to a backside 122 of the substrate 104 via a conduit 116. One or more second conduits (not shown) may be provided to deliver the purge gas proximate the edge of the substrate 104.

The inventors have observed that conventional substrate supports utilized in deposition process chambers typically include a heater plate (e.g., plate 106) fabricated from a steel alloy, for example, such as stainless steel. However, the inventors have observed that the low heat conductivity of stainless steel creates a temperature gradient across the heating plate (e.g., a temperature range from the center to edge of the heater plate), causing uneven heating of the substrate, thereby leading to process non-uniformities. In addition, the high (radio frequency) RF resistivity of the stainless steel causes non-uniform plasma distribution, thereby further leading to non-uniform deposition of materials atop the substrate.

Accordingly, in some embodiments, the heater plate 106 may be fabricated from aluminum (Al). The inventors have discovered that a heater plate fabricated from aluminum may provide an improved heat distribution over conventionally utilized stainless steel heater plates due to the high heat conductivity of aluminum as compared to stainless steel. In addition, because of the lower RF resistivity of aluminum (as compared to stainless steel), an improved RF grounding path may be provided, thereby providing an improved plasma uniformity.

Figure 2:
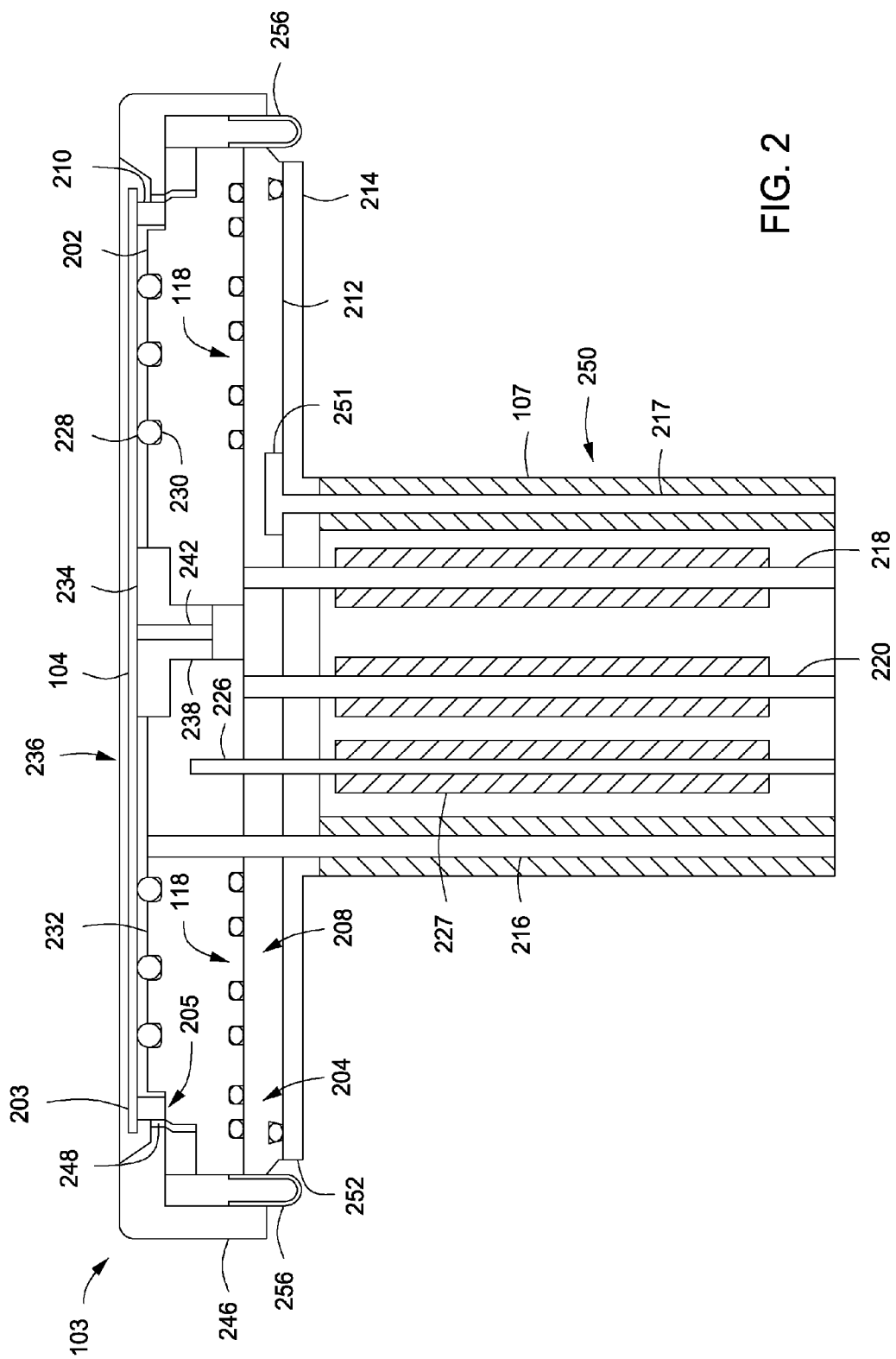
FIG. 2 depicts a substrate support in accordance with some embodiments of the present invention.

Details of the substrate support 103 in accordance with at least some embodiments of the invention are further described in FIG. 2, which depicts a more detailed view of the substrate support 103 of FIG. 1. In FIG. 2, an embodiment of the heater plate 106 is shown as heater plate 202 (e.g., a first plate). In some embodiments, the heating elements 118 may be embedded or recessed within the heater plate 202, such as shown in FIG. 2. In some embodiments, the heating elements 118 may be configured such that multiple heating zones (e.g., outer heating zone 204 and inner heating zone 208 as shown) are present across the heater plate 202. Greater or fewer zones may also be provided.

In some embodiments, the substrate support 103 may comprise one or more additional plates (such as second plate 212 and third plate 214 shown in FIG. 2) disposed beneath the heater plate 202 (e.g., the first plate). In such embodiments, the additional plates (e.g., 212, 214) may be fabricated from aluminum. By fabricating all of the substrate support plates (i.e., the heater plate 202, second plate 212 and third plate 214) from aluminum, the inventors have observed that a heat transfer from the heating elements may be faster and more uniform, as compared to conventional substrate support plates fabricated from, for example, stainless steel. The substrate support plates may be coupled together via any process suitable to couple aluminum, for example, such as welding, brazing or the like.

The inventors have observed that when using a substrate support having a metal heater plate (e.g., substrate support 103 and heater plate 202) during a substrate process (e.g., a deposition process), contamination of the substrate may occur as a result of metal to substrate contact. For example, when utilizing a conventional heater plate fabricated from stainless steel, iron (Fe) from the heater plate may diffuse into a back surface of the substrate, thereby contaminating the substrate. Accordingly, in some embodiments, a plurality of non-metallic spacers 228 may be disposed between the substrate 104 and the heater plate 202. The inventors have observed that by providing the plurality of non-metallic spacers 228, the substrate 104 is supported above the heater plate 202 during processing, thereby eliminating any direct substrate 104 to metal contact, thus reducing or eliminating contamination of the substrate 104. In addition, the inventors have observed that by supporting the substrate 104 above the heater the gap 232 formed between the substrate 104 and the heater plate 202 provides an improved substrate backside pressure control that reduces vacuum pressure drop at the substrate edge, thereby retaining a desired clamping force on the substrate.

The non-metallic spacers 228 may be fabricated from any non-metallic material suitable to support the substrate 104 above the heater plate 202 while being resistant to the environment within the process chamber during processing. For example, in some embodiments, the non-metallic spacers 228 may be fabricated from a crystalline form of aluminum oxide ($Al_2O_3$) (e.g., sapphire), aluminum nitride (AlN), or the like. The non-metallic spacers 228 may have any shape suitable to support the substrate 104. For example, in some embodiments, each non-metallic spacer 228 may be substantially spherical and may be held in place in corresponding recesses formed in an upper surface of the heater plate 202. The size of the non-metallic spacers 228 may selected to provide the gap 232 with a size sufficient to prevent contamination of the substrate 104 from material of the heater plate 202. For example, in some embodiments, the gap 232 may be about 0.002 to about 0.010 inches, or in some embodiments, about 0.007 inches.

The non-metallic spacers 228 may be disposed between the substrate 104 and heater plate 202 in any manner suitable to support the substrate 104 in a static position during processing. For example, in some embodiments, the non-metallic spacers 228 may be partially recessed into openings 230 formed in the heater plate 202. In such embodiments, the non-metallic spacers 228 maybe secured in place via any means suitable, for example, such as a swaging process (e.g., via a swage press).

In addition to the non-metallic spacers 228, in some embodiments, a non-metallic seal ring 210 may be disposed atop the heater plate 202 to further support the substrate 104 above the heater plate 202 and to provide a seal between the processing volume within the process chamber and the region between the substrate and the heater plate (e.g., the gap 232). When present, the non-metallic seal ring 210 supports the substrate 104 proximate a peripheral edge 203 of the substrate. The non-metallic seal ring 210 may be fabricated from any non-metallic material suitable to support the substrate 104 above the heater plate 202 while being resistant to the processing environment. For example, in some embodiments, the non-metallic seal ring 210 may be fabricated from aluminum nitride (AlN), aluminum oxide ($Al_2O_3$) or the like.

The non-metallic seal ring 210 may have any thickness suitable to support the substrate 104 such that a desired gap (e.g., the gap 232 discussed above) is formed between the substrate 104 and heater plate 202. However, the inventors have observed that as the thickness of the non-metallic seal ring 210 increases, the non-metallic seal ring 210 may be susceptible to breakage due to thermal stresses. Moreover, as the thickness of the non-metallic seal ring 210 increases, an impedance difference between a center of the substrate 104 and an edge of the substrate 104 during processing may increase, leading to process non-uniformities. Accordingly, in some embodiments, the non-metallic seal ring 210 may be about 0.10 to about 0.30 inches thick. The non-metallic seal ring 210 may be positioned atop the heater plate 202 in any manner suitable to support the substrate 104 above the heater plate 202. For example, in some embodiments, the non-metallic seal ring 210 may be disposed directly atop a top surface of a peripheral edge of the heater plate 202. In some embodiments, the non-metallic seal ring 210 may sit on a recess or cutout 205 of the heater plate 202, such as shown in FIG. 2.

Figure 3:
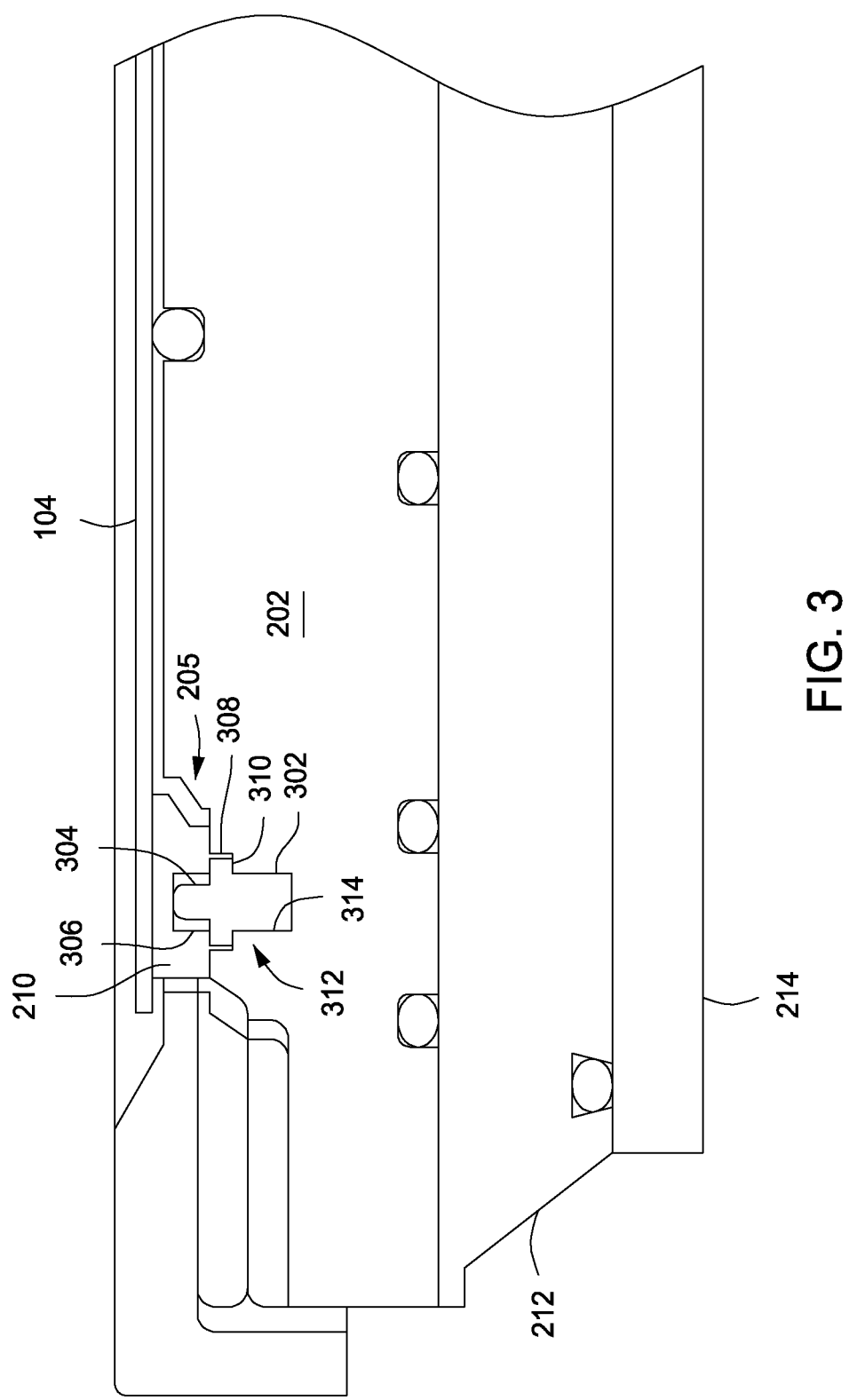
FIGS. 3-5 depict portions of the substrate support of FIG. 2 in accordance with some embodiments of the present invention.

In some embodiments, one or more pins may be utilized to center the non-metallic seal ring 210 with respect to the heater plate 202. For example, FIG. 3 depicts a pin 312 extending from the heater plate 202 to center the non-metallic seal ring 210 with respect to the heater plate 202. The one or more pins 312 may comprise any electrically insulating material, such a ceramic, for example, aluminum oxide ($Al_2O_3$), aluminum nitride (AlN), or the like. In some embodiments, each of the one or more pins 312 may comprise a top portion 304 configured to interface with a feature 306 formed in the non-metallic seal ring 210 and a bottom portion 314 configured to interface with a recess 302 formed in the heater plate 202. In some embodiments, each of the each of the one or more pins 312 may comprise a flange 308 configured to interface with a top portion 310 of the recess 302. In some embodiments, three pins 312 may be provided in an azimuthally symmetric arrangement.

Referring back to FIG. 2, in addition to the non-metallic spacers 228, in some embodiments, a non-metallic disk 234 may be disposed proximate a center 236 of the heater plate 202 to further support the substrate 104 above the heater plate 202. The non-metallic disk 234 may comprise any electrically insulating material, such a ceramic, for example, aluminum oxide ($Al_2O_3$), aluminum nitride (AlN), or the like. In some embodiments, the non-metallic disk 234 may be at least partially recessed into an opening formed in the heater plate 202.

In some embodiments, the non-metallic disk 234 may include a shaft 238 coupled to and extending outwardly from a bottom portion of the non-metallic disk 234 and through a corresponding opening in the heater plate 202. In such embodiments, the shaft 238 and non-metallic disk 234 may include a through hole 242 to prevent gas from being trapped between the non-metallic disk 234 and the heater plate 202. The shaft 238 may be fabricated from a different, or in some embodiments, the same material used to fabricate the non-metallic disk 234. In some embodiments, the shaft 238 and non-metallic disk 234 may be fabricated from a single piece of material, thereby providing a single unitary part comprising the shaft 238 and non-metallic disk 234.

In some embodiments, the substrate support shaft 107 may generally comprise a body 250 having one or more conduits (two conduits 216, 217 shown) formed therein. The body 250 may be fabricated from any material suitable to support the substrate support 103, for example, a metal, such as aluminum, or the like.

By utilizing conduits 216, 217 formed in the body 250 of the substrate support shaft 107, the inventors have discovered that the conduits 216, 217 are less susceptible to degradation or failure as compared to conventional substrate support shafts that utilized separate components to form conduits. In some embodiments, the conduits 216, 217 may be configured to provide gases (e.g., purge gases), a vacuum, or the like, to the heater plate 202. For example, in some embodiments a first conduit (e.g., conduit 217) may provide one or more gases to a purge channel 248 via a series of channels 251, 252 formed in the third plate 214. In some embodiments, a second conduit (e.g., conduit 216) may be coupled to a vacuum (not shown) to facilitate chucking the substrate 104 to the substrate support 103.

In some embodiments, one or more power supply lines (two power supply lines 220, 218 shown) may be disposed within the substrate support shaft 107 to provide power from a power supply (e.g., power source 111 described above) to the heating elements 118. In addition, in some embodiments, a thermocouple probe 226 may be disposed within the substrate support shaft 107 and extending into a portion of the heater plate 202 to facilitate monitoring a temperature of the heater plate 202. In some embodiments, at least a portion of the thermocouple probe 226 and/or the power supply lines 220, 218 may be enclosed within an aluminum tube (aluminum tube 227 shown for thermocouple probe 226). In some embodiments, the aluminum tube 227 may be coupled to the substrate support shaft 107 via any process suitable to provide a secure coupling, for example, via welding, brazing or the like. By enclosing the thermocouple probe within the aluminum tube 227, the inventors have observed that a noise coupling from the power supply lines 220, 218 and the thermocouple probe 226 may be reduced or eliminated, thereby facilitating a more accurate reading from the thermocouple probe 226.

In some embodiments, a purge ring 246 may be disposed on the heater plate 202 to define the purge channel 248 to provide a purge gas to a peripheral portion of the substrate 104 to prevent deposition thereon. In some embodiments, the purge ring 246 may be fabricated from a metal, such as aluminum (Al), stainless steel, or the like, or a non-metal material, such a aluminum oxide ($Al_2O_3$), aluminum nitride (AlN), or the like.

In such embodiments, the inventors have observed that conventionally utilized mechanisms (e.g., via multiple springs and/or metal skirting) to provide a grounding path for a purge ring (e.g., purge ring 246) fail to provide reliable grounding. Accordingly, in some embodiments, the purge ring 246 and the heater plate 202 may be coupled to one another via a plurality of metal clips (two metal clips 256 shown). The inventors have discovered that utilizing the metal clips 256 to couple each of the purge ring 246 and heater plate 202 provides a more secure and reliable coupling, and therefore a better grounding, as compared to, for example, a spring force contact typically used in conventional substrate supports. The inventors have further discovered that the improved coupling and grounding allows the heater (e.g., heating elements 118 and the heater plate 202 described above) to be reliably operated at broad range of RF frequencies for plasma processes, for example, such as 13.56 MHz, 40 Mhz, or higher.

Figure 4:
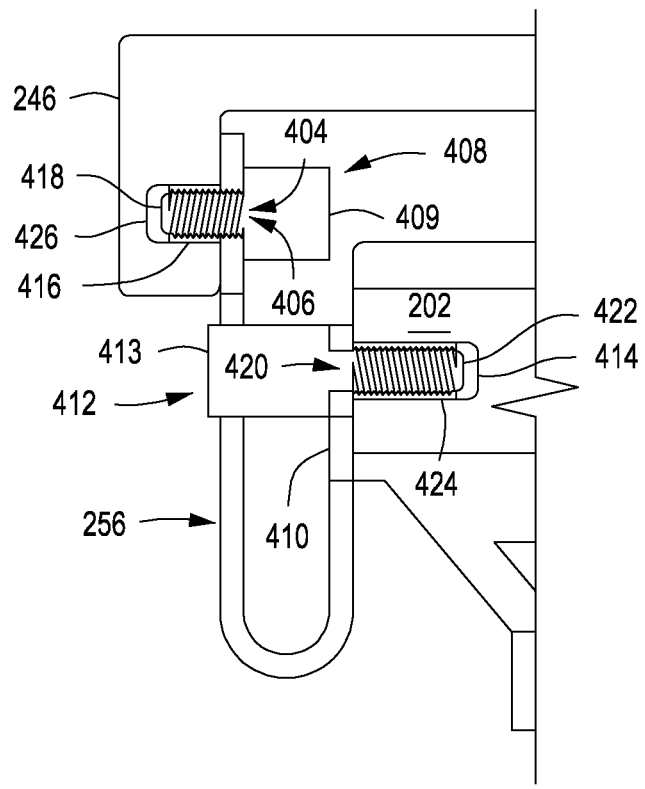
Figure 5:
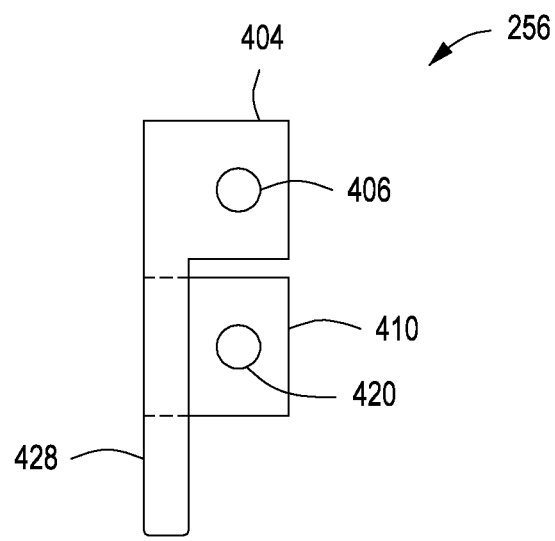

Referring to FIG. 4, in some embodiments, each of the plurality of metal clips 256 may comprise a first end 404, a second end 410 and a u-shaped portion 428 disposed between and coupling the first end 404 to the second end 410. Each of the first end 404 and second end 410 include a through hole 406, 420 configured to accommodate a fastener 408, 412. In some embodiments, the first end 404 and second end 410 may extend outwardly from the u-shaped portion and may be offset from one another, such as shown in FIG. 5. Configuring the first end 404 and second end 410 in such a manner allows for clear access to each through hole 406, 420, thereby allowing for a simple installation.

Referring back to FIG. 4, the fastener 408, 412 can be any type of fastener suitable to couple the metal clips 256 to the purge ring 246 and heater plate 202 while providing an adequate connection to facilitate an electrical grounding of the purge ring 246. For example, the fastener 408, 412 may be a rivet, screw, bolt, or the like. In embodiments where the fastener 408, 412 is a bolt, for example such as shown in FIG. 4, the fastener 408, 412 may comprise a head 409, 413 configured to interface with a tool to allow tightening of the fastener 408, 412 and a threaded portion 418, 422 configured to interface with a hole 414, 426 disposed the purge ring 246 and heater plate 202. In some embodiments, the hole 414, 426 may comprise internal threads configured to mate with the threaded portion 418, 422 of the fastener 408, 412. Alternatively, an insert 416, 424 may be press fit within the hole 414, 426.

Figure 6:
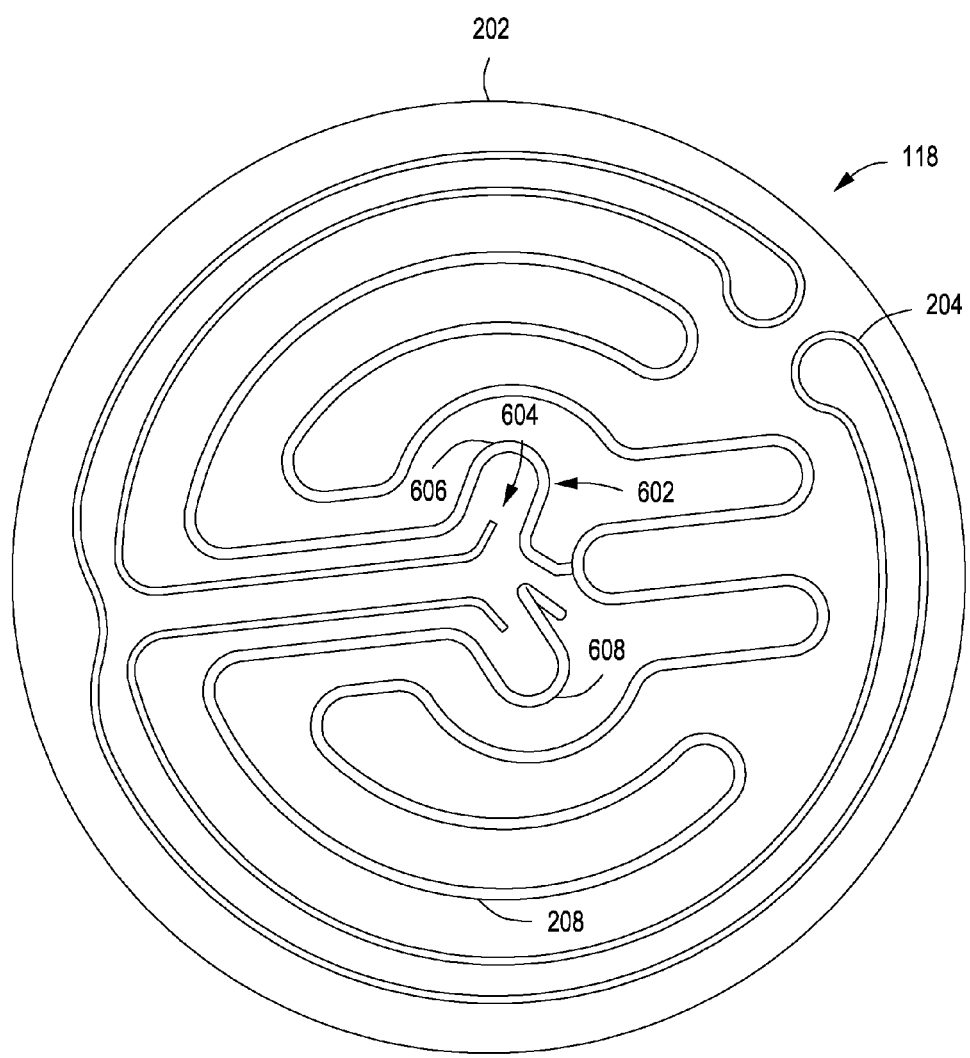
FIG. 6 depicts a heater element configuration suitable for use with a substrate support in accordance with some embodiments of the present invention.

Referring to FIG. 6, the heating elements 118 may be configured in any manner to provide a suitable temperature provide to the heater plate 202 for a particular process being performed. For example, in some embodiments, each of the outer heating zone 204 and inner heating zone 208 heating elements 118 may be configured in a recursive pattern, for example, as shown in FIG. 6. In some embodiments, the heating elements 118 for the inner heating zone 208 may comprise a recursive pattern 602 having one or more loops (two loops 606, 608 shown) disposed proximate a center 604 of the heater plate 202. By providing the heating elements 118 in such a manner, the inventors have discovered that a temperature proximate the center 604 of the heater plate 202 may increase, thereby providing a temperature profile having an improved uniformity across the heater plate, as compared to conventionally configured heater elements.

Thus, embodiments of substrate supports that may provide one or more of backside contamination control, improved heat distribution, and improved plasma uniformity have been provided herein. The inventive substrate support may advantageously support a substrate above a heater plate during processing, thereby eliminating any direct substrate to metal contact, thus reducing or eliminating contamination of the substrate. The inventive substrate support may further advantageously provide a heater plate fabricated from aluminum, thereby providing an improved heat distribution over conventionally utilized stainless steel heater plates. In addition, the lower RF resistivity of aluminum (as compared to stainless steel) provides an improved RF grounding path, resulting in improved plasma uniformity.

While the foregoing is directed to embodiments of the present invention, other and further embodiments of the invention may be devised without departing from the basic scope thereof.

The invention claimed is:

1. A substrate support, comprising:
   a first aluminum plate for supporting a substrate, the first aluminum plate having a plurality of heating elements embedded therein to provide a plurality of heating zones;
   a second aluminum plate disposed beneath and supporting the first aluminum plate;
   a third aluminum plate disposed beneath and supporting the second aluminum plate;
   a non-metallic ring disposed atop the first aluminum plate, wherein the non-metallic ring is fabricated from aluminum nitride (AlN) or aluminum oxide ($Al_2O_3$);
   a plurality of spacers having an upper portion disposed above a surface of the first aluminum plate, wherein the non-metallic ring and the plurality of spacers support the substrate above the first aluminum plate; and
   a non-metallic disk disposed proximate a center of the first aluminum plate, the non-metallic disk having an upper portion disposed above a top surface of the first aluminum plate and a shaft coupled to a bottom of the non-metallic disk, wherein the non-metallic disk, non-metallic ring, and the plurality of spacers support the substrate above the first aluminum plate, and wherein the shaft is disposed within a through hole formed in the first aluminum late.

2. The substrate support of claim 1, wherein the plurality of spacers are at least partially recessed into a top surface of the first aluminum plate.

3. The substrate support of claim 1, wherein the plurality of spacers have a substantially spherical shape.

4. The substrate support of claim 1, wherein the non-metallic ring and the plurality of spacers support the substrate about 0.002 to about 0.010 inches above the first aluminum plate.

5. The substrate support of claim 1, wherein the plurality of spacers are fabricated from sapphire.

6. The substrate support of claim 1, wherein the first aluminum plate further comprises a plurality of channels formed in a bottom surface of the first aluminum plate, wherein the heating elements are disposed within the plurality of channels, and wherein the heating elements are secured in the plurality of channels by the second aluminum plate.

7. The substrate support of claim 1, further comprising:
a plurality of pins, each having a first end disposed in a feature of the first aluminum plate and a second end extending beyond a top surface of the first aluminum plate and configured to interface with a feature formed in a bottom surface of the non-metallic ring to maintain the non-metallic ring in a desired position.

8. The substrate support of claim 1, wherein the non-metallic disk is at least partially recessed into the first aluminum plate.

9. The substrate support of claim 1, wherein the non-metallic disk is fabricated from aluminum nitride (AlN) or aluminum oxide ($Al_2O_3$).

10. The substrate support of claim 1, wherein the plurality of heating elements comprise:
a first heater element configured to provide heat to an inner portion of the first aluminum plate; and
a second heater element configured to provide heat to an outer portion of the first aluminum plate.

11. The substrate support of claim 10, wherein a portion of the first heater element comprises two or more curved sections disposed proximate a center of the first aluminum plate to provide heat to an area proximate the center of the first aluminum plate.

12. The substrate support of claim 1, further comprising a support shaft disposed beneath the third aluminum plate to support the third aluminum plate, the support shaft comprising:
a body having a hollow portion formed within the body; and
one or more conduits formed in the body, wherein each of the one or more conduits are configured to provide a gas or apply a vacuum to an area above the first aluminum plate.

13. The substrate support of claim 12, wherein the support shaft further comprises:
a thermocouple to provide a temperature of the first aluminum plate, the thermocouple disposed within the hollow portion of the support shaft; and
an aluminum tube surrounding the thermocouple.

14. The substrate support of claim 12, wherein the support shaft is fabricated from aluminum.

15. A substrate support, comprising:
a first aluminum plate for supporting a substrate, the first aluminum plate having a plurality of heating elements embedded therein to provide a plurality of heating zones;
a second aluminum plate disposed beneath and supporting the first aluminum plate;
a third aluminum plate disposed beneath and supporting the second aluminum plate;
a non-metallic ring disposed atop the first aluminum plate;
a plurality of spacers having an upper portion disposed above a surface of the first aluminum plate, wherein the non-metallic ring and the plurality of spacers support the substrate above the first aluminum plate;
a purge ring disposed about a periphery of the first aluminum plate; and
a plurality of metal clips, wherein each of the plurality of metal clips comprise a first end coupled to the purge ring, a second end coupled to the first aluminum plate and a curved section coupling the first end to the second end, and wherein the plurality of metal clips electrically couple the purge ring to the first aluminum plate.

16. The substrate support of claim 15, wherein the first end and second end of each of the plurality of metal clips comprise a through hole configured to allow the first end and second end to be coupled to the first aluminum plate and purge ring via one or more fasteners.

17. A process chamber, comprising:
a chamber body having an inner volume;
a substrate support disposed within the inner volume of the chamber body, the substrate support comprising:
a first aluminum plate for supporting a substrate, the first aluminum plate having a plurality of heating elements embedded therein to provide a plurality of heating zones;
a second aluminum plate disposed beneath and supporting the first aluminum plate;
a third aluminum plate disposed beneath and supporting the second aluminum plate;
a non-metallic ring disposed atop the first aluminum plate;
a plurality of spacers having an upper portion disposed above a surface of the first aluminum plate, wherein the non-metallic ring and the plurality of spacers support the substrate above the first aluminum plate;
a purge ring disposed about a periphery of the first aluminum plate; and
a plurality of metal strips, wherein each of the plurality of metal strips comprise a first end coupled to the purge ring, a second end coupled to the first aluminum plate and a curved section coupling the first end to the second end, and wherein the plurality of metal strips electrically couple the purge ring to the first aluminum plate.

18. The substrate support of claim 1, wherein the non-metallic disk further comprises:
a through hole extending through the shaft and the non-metallic disk to prevent gas from being trapped between the non-metallic disk and the first aluminum plate.

* * * * *